(12) United States Patent
Noya

(10) Patent No.: US 9,152,052 B2
(45) Date of Patent: Oct. 6, 2015

(54) COMPOSITION FOR FORMING TUNGSTEN OXIDE FILM AND METHOD FOR PRODUCING TUNGSTEN OXIDE FILM USING SAME

(75) Inventor: Go Noya, Shizuoka (JP)

(73) Assignee: MERCK PATENT GMBH, Darnstadt (DE)

( * ) Notice: Subject to any disclaimer, the term of this patent is extended or adjusted under 35 U.S.C. 154(b) by 0 days.

(21) Appl. No.: 14/237,720

(22) PCT Filed: Aug. 10, 2012

(86) PCT No.: PCT/JP2012/070426
§ 371 (c)(1),
(2), (4) Date: Jul. 23, 2014

(87) PCT Pub. No.: WO2013/022081
PCT Pub. Date: Feb. 14, 2013

(65) Prior Publication Data
US 2014/0356792 A1  Dec. 4, 2014

(30) Foreign Application Priority Data
Aug. 11, 2011  (JP) .................................. 2011-176132

(51) Int. Cl.
G03F 7/20 (2006.01)
G03F 7/11 (2006.01)
(Continued)

(52) U.S. Cl.
CPC  *G03F 7/11* (2013.01); *G03F 7/091* (2013.01); *G03F 7/094* (2013.01); *G03F 7/20* (2013.01);
(Continued)

(58) Field of Classification Search
CPC ............ H01L 21/02244; H01L 21/308; H01L 21/3081; G03F 7/11; G03F 7/20; G03F 7/40
USPC .................. 430/311, 322, 325, 330, 324, 314
See application file for complete search history.

(56) References Cited

U.S. PATENT DOCUMENTS 3,474,054 A  10/1969  White
4,200,729 A   4/1980  Calbo
(Continued)

FOREIGN PATENT DOCUMENTS

EP  2 447 775 A1  5/2012
JP  63-56529 A    3/1988
(Continued)

OTHER PUBLICATIONS

Form PCT/ISA/220, Form PCT/ISA/210, and Form PCT/ISA/237 for PPCT/EP2013/075815 dated Jul. 9, 2014 which corresponds to U.S. Appl. No. 13/707,993.

(Continued)

Primary Examiner — Caleen Sullivan
(74) Attorney, Agent, or Firm — Sangya Jain

(57) ABSTRACT

[Object]
To provide a composition for forming a tungsten oxide film from an aqueous solution, and also to provide a pattern formation method employing that composition.
[Means]
The present invention provides a tungsten oxide film-forming composition comprising: water, a water-soluble metatungstate, and at least one additive selected from the group consisting of anionic polymers, nonionic polymers, anionic surfactants, and tertiary amino group-containing nonionic surfactants. For forming a pattern, this composition can be employed in place of a silicon dioxide film-forming composition in a pattern formation process using an image reversal trilayer structure, a resist undercoat layer or a resist top protective film.

17 Claims, 1 Drawing Sheet

(51) Int. Cl.
*G03F 7/40* (2006.01)
*H01L 21/02* (2006.01)
*H01L 21/308* (2006.01)
*G03F 7/09* (2006.01)

(52) U.S. Cl.
CPC .............. *G03F 7/2016* (2013.01); *G03F 7/40* (2013.01); *H01L 21/02244* (2013.01); *H01L 21/308* (2013.01); *H01L 21/3081* (2013.01)

(56) References Cited

U.S. PATENT DOCUMENTS

| | | | |
|---|---|---|---|
| 4,251,665 | A | 2/1981 | Calbo |
| 4,491,628 | A | 1/1985 | Ito et al. |
| 5,178,989 | A | 1/1993 | Heller et al. |
| 5,187,019 | A | 2/1993 | Calbo et al. |
| 5,350,660 | A | 9/1994 | Urano et al. |
| 5,772,978 | A * | 6/1998 | Bailey et al. ............ 423/606 |
| 5,843,624 | A | 12/1998 | Houlihan et al. |
| 5,879,859 | A | 3/1999 | Buchwalter et al. |
| 6,242,156 | B1 | 6/2001 | Teng |
| 6,348,299 | B1 | 2/2002 | Aviram et al. |
| 6,447,980 | B1 | 9/2002 | Rahman et al. |
| 6,723,488 | B2 | 4/2004 | Kudo et al. |
| 6,790,587 | B1 | 9/2004 | Feiring et al. |
| 6,818,258 | B2 | 11/2004 | Kaneko et al. |
| 6,849,377 | B2 | 2/2005 | Feiring et al. |
| 6,866,984 | B2 | 3/2005 | Jung et al. |
| 6,916,590 | B2 | 7/2005 | Kaneko et al. |
| 7,416,834 | B2 | 8/2008 | Abdallah et al. |
| 7,727,902 | B2 | 6/2010 | Takei et al. |
| 7,767,368 | B2 | 8/2010 | Fukushima et al. |
| 7,799,396 | B2 | 9/2010 | Uehara et al. |
| 7,803,458 | B2 | 9/2010 | Flaim et al. |
| 8,039,201 | B2 | 10/2011 | Yao et al. |
| 8,568,958 | B2 | 10/2013 | Yao et al. |
| 2003/0235786 | A1 | 12/2003 | Krishnamurthy et al. |
| 2004/0029041 | A1 | 2/2004 | Shih et al. |
| 2004/0058275 | A1 | 3/2004 | Neef et al. |
| 2004/0102048 | A1 | 5/2004 | Yamaguchi |
| 2004/0181031 | A1 | 9/2004 | Nogi et al. |
| 2004/0224616 | A1 | 11/2004 | Shiho et al. |
| 2005/0164133 | A1* | 7/2005 | Rangarajan et al. ......... 430/322 |
| 2006/0263708 | A1 | 11/2006 | Wu et al. |
| 2007/0015083 | A1 | 1/2007 | Babich et al. |
| 2007/0116640 | A1 | 5/2007 | Kim et al. |
| 2007/0134916 | A1 | 6/2007 | Iwabuchi et al. |
| 2007/0224483 | A1 | 9/2007 | Alberti et al. |
| 2007/0243473 | A1 | 10/2007 | Mizushima et al. |
| 2008/0044764 | A1 | 2/2008 | Takahashi et al. |
| 2008/0076064 | A1 | 3/2008 | Sun |
| 2009/0239080 | A1 | 9/2009 | Ito et al. |
| 2009/0286188 | A1 | 11/2009 | Hatakeyama et al. |
| 2010/0028804 | A1 | 2/2010 | Iwato et al. |
| 2010/0099044 | A1 | 4/2010 | Hatakeyama et al. |
| 2010/0130697 | A1 | 5/2010 | Katayama et al. |
| 2011/0081615 | A1 | 4/2011 | Kon |
| 2011/0207864 | A1 | 8/2011 | Nakamura et al. |
| 2012/0178261 | A1 | 7/2012 | Kanno et al. |
| 2012/0223418 | A1 | 9/2012 | Stowers et al. |
| 2012/0264039 | A1 | 10/2012 | Ito et al. |
| 2012/0288300 | A1 | 11/2012 | Matsusaki et al. |
| 2012/0328990 | A1 | 12/2012 | Yao et al. |
| 2013/0040140 | A1 | 2/2013 | Joo et al. |
| 2013/0123137 | A1 | 5/2013 | Reichardt et al. |
| 2014/0000948 | A1 | 1/2014 | Nagai et al. |
| 2014/0159278 | A1 | 6/2014 | Yao et al. |
| 2014/0356792 | A1 | 12/2014 | Noya |
| 2015/0004801 | A1 | 1/2015 | Rahman et al. |
| 2015/0064904 | A1 | 3/2015 | Yao et al. |

FOREIGN PATENT DOCUMENTS

| | | |
|---|---|---|
| JP | 3-138922 A | 6/1991 |
| JP | 6-32756 A | 2/1994 |
| JP | 2000-10293 A | 1/2000 |
| JP | 2004-179254 A | 6/2004 |
| JP | 2005-307101 A | 11/2005 |
| JP | 2006-98284 A | 4/2006 |
| JP | 2007-61720 A | 3/2007 |
| WO | WO 2010/021347 A1 | 2/2010 |

OTHER PUBLICATIONS

Baxendale et al., "The Reduction of Molybdenum(II) Trifluoroacetate by Pulse Radiolysis in Methanol", Journal of the American Chemical Society vol. 98 No. 2, pp. 637-pp. 638 (1976).
Burch et al., "Scrambling of Fluoro-, Methoxyl, Dimethylamino-, and Methyl Gropus with Chlorine Atoms of Methoxyl with Dimethylaminol-Groups on Germanium", J. Chm. Soc. (A), pp. 586-pp. 589 (1966).
Sartori et al., "Uber die Darstellung und Eigenschaften von Perflouracyloxy-Verbindungen der vierten Gruppe des Periodensystems", Chem. Ber. vol. 100 No. 6, pp. 2049-pp. 2063 (1967).
Notification of the First Office Action dated Sep. 1, 2014 from the Chinese Patent Office for CN2012800262639, which corresponds to U.S. Appl. No. 13/164,869.
English Translation of Notification of the First Office Action dated Sep. 1, 2014 from the Chinese Patent Office for CN2012800262639, which corresponds to U.S. Appl. No. 13/164,869.
Form PCT/ISA/220, Form PCT/ISA/210, and Form PCT/ISA/237 dated Nov. 28, 2014 for PCT/EP2014/067749, which corresponds to U.S. Appl. No. 14/015,222.
Office Action notification date Mar. 31, 2015 for U.S. Appl. No. 13/930,711.
Form PCT/ISA/220, Form PCT/ISA/210, and Form PCT/ISA/237 dated Feb. 6, 2015 for PCT/EP2014/076919, which corresponds to U.S. Appl. No. 14/015,222.
Restriction Requirement notification date Mar. 12, 2015 for U.S. Appl. No. 13/707,993.
Form PCT/ISA/220, Form PCT/ISA/210, and Form PCT/ISA/237 dated Aug. 11, 2014 for PCT/EP2014/063593 which corresponds to U.S. Appl. No. 13/930,711.
Satterfield, C. W., Heterogeneous Catalysis in Industrial Practice, 2nd Edition, McGraw-Hill, Inc., New York, Chapter 1, pp. 1-pp. 30 (1991).
Restriction Requirement notification date May 11, 2015 for U.S. Appl. No. 14/015,222.
Office Action notification date Jul. 10, 2015 for U.S. Appl. No. 14/154,929.

* cited by examiner

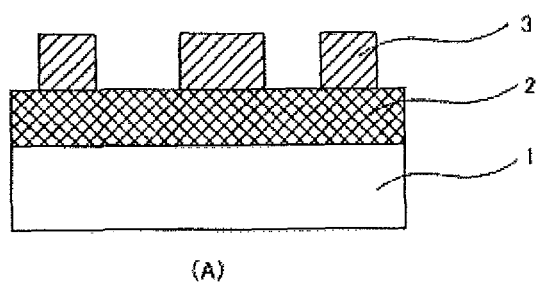
(A)
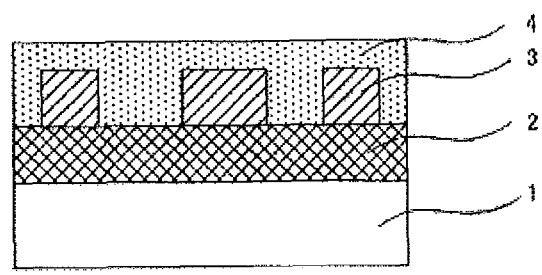
(B)
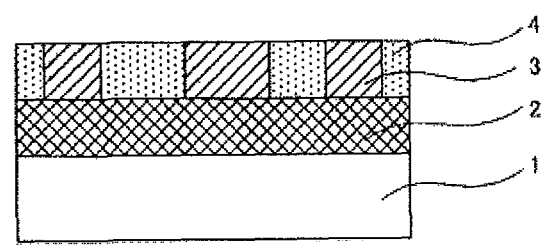
(C)
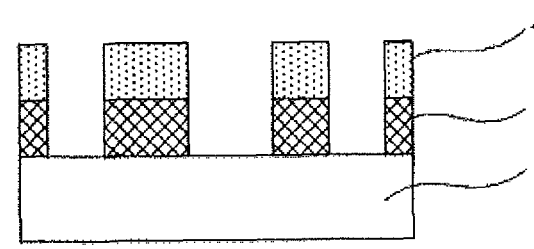
(D)

COMPOSITION FOR FORMING TUNGSTEN OXIDE FILM AND METHOD FOR PRODUCING TUNGSTEN OXIDE FILM USING SAME

This application is a U.S. National Stage Patent Application under 35 U.S.C.§371 of International Patent Application No. PCT/JP2012/070426, filed Aug. 10, 2012, which claims priority to Japanese Patent Applications No.2011-176132, filed Aug. 11, 2011 the contents of both documents being hereby incorporated herein by reference.

TECHNICAL FIELD

This invention relates to a tungsten oxide film-forming composition used in processes for producing semiconductor devices, particularly, by use of lithographic techniques. Further, the present invention also relates to a process for forming a tungsten oxide film formed from that composition.

BACKGROUND ART

Photolithography has hitherto been used in the manufacture of flat panel displays (FPDs) such as liquid crystal displays, semiconductor devices, charge-coupled devices (CCDs) or color filters. For example, in a photolithographic process for producing integrated circuits, a positive- or negative-working resist is cast on a substrate, then baked to remove the solvent, thereafter exposed to radiation such as UV light, far UV light, electron beams or X-rays, and finally developed to form a resist pattern.

In accordance with recent technological progress, semiconductor devices have been required to be highly integrated and hence miniaturization of resist patterns has been regarded as a problem to solve. Meanwhile, it has been also desired to provide a method capable of producing semiconductor devices at low cost and in high productivity. In view of this background, various photolithographic processes have been studied and brought into practice. Further, according to that, various researches have been made on new materials employed in those lithographic processes.

Hitherto, silicon oxide films have been generally adopted as masks of photoresist. The silicon oxide films can be relatively easily formed by casting and then firing compositions containing, for example, polysilazane, polysiloxane or the like, and therefore have been used in a great many processes. However, even the silicon oxide films cannot always fulfill their functions, and accordingly there is a case where the masks need to be made of new materials in place of silicon oxide. As one of those new materials, tungsten oxide is proposed.

Tungsten oxide films have a relatively low volume shrinkage ratio, and accordingly hardly suffer from defects such as voids. Further, they also have another advantage of being easily removed away by washing with water or the like. Accordingly, the tungsten oxide films often exhibit properties more advantageous than the silicon oxide ones. However, it has been difficult to produce tungsten oxide films by casting compositions in the same manner as the silicon oxide films, and hence they have been generally produced according to vapor deposition methods. Because of that, there is a problem in that the productivity thereof cannot be enhanced.

Although there is a known method to form a tungsten oxide film from an aqueous solution (e.g., Patent document 1), there is not any known method in which both coatability and film-formability are satisfying enough to apply to lithographic processes for producing semiconductor devices.

PRIOR ART DOCUMENTS

Patent Documents

[Patent document 1] Japanese Patent Laid-Open No. 2006-98284

Non-Patent Documents

[Non-patent document 1] "Image Reversal Trilayer Process Using Standard Positive Photoresist", D. J. Abdallah, et al., Proc. of SPIE, Vol. 7223, 72732K

[Non-patent document 2] "193-nm Multilayer Imaging System", J. D. Meador et al., Proc. of SPIE, Vol. 5039, 948-959

[Non-patent document 3] "New Materials for 193-nm Trilayer Imaging", J. D. Meador et al., Proc. of SPIE, Vol. 5376, 1138-1148

DISCLOSURE OF INVENTION

Problem to be Solved by the Invention

In view of the above problem, it is an object of the present invention to provide a tungsten oxide film-forming composition which enables to form a tungsten oxide film easily and efficiently. Further, the present invention also aims to provide a method suitable for producing semiconductor devices by use of the above composition.

Means for Solving Problem

The present invention resides in a composition for forming a tungsten oxide film, comprising water, a water-soluble metatungstate, and at least one additive selected from the group consisting of anionic polymers, nonionic polymers, anionic surfactants, and tertiary amino group-containing nonionic surfactants, said composition being used for forming an image reversal trilayer structure, a resist undercoat layer or a resist top protective film.

The present invention also resides in a process for forming a tungsten oxide film, wherein the above composition for forming a tungsten oxide film is cast on a substrate and then fired.

The present invention still also resides in a pattern formation method comprising the steps of:

forming a hard mask on a substrate;

forming a photoresist pattern according to the aimed pattern on said hard mask;

casting on said photoresist pattern and then heating the above composition for forming a tungsten oxide film, so as to cover said photoresist pattern with a tungsten oxide film;

removing by etching the tungsten oxide film formed in the area on the top surface of said photoresist pattern, so as to bare the top surface of said photoresist pattern; and removing by etching said photoresist pattern by use of said tungsten oxide film as a photomask, and further transferring said photoresist pattern onto said hard mask.

The present invention further resides in another pattern formation method comprising the steps of:

casting on a substrate and then heating the above composition for forming a tungsten oxide film, so as to form a tungsten oxide film;

forming a photoresist pattern on said tungsten oxide film;

etching said tungsten oxide film by use of said photoresist pattern as a photomask, so as to transfer the photoresist pattern onto the tungsten oxide film; and etching said substrate by use of said patterned tungsten oxide film as a photomask.

The present invention furthermore resides in still another pattern formation method comprising the steps of:

casting a resist composition on a substrate, so as to form a resist layer;

casting on said resist layer and then heating the above composition for forming a tungsten oxide film, so as to form a tungsten oxide film;

carrying out imagewise exposure; and carrying out development.

Effect of the Invention

The present invention makes it possible to form a tungsten oxide film from an aqueous solution by coating, and hence the tungsten oxide film can be formed easily and efficiently. In addition, this tungsten oxide film hardly undergoes crystallization in the course of film-formation, and also can be easily removed by washing with water or the like. Accordingly, it can be realized to improve the productivity of semiconductor devices or the like.

BRIEF DESCRIPTION OF THE DRAWINGS

FIG. 1 shows schematic views illustrating a pattern formation method using an image reversal trilayer structure.

BEST MODE FOR CARRYING OUT THE INVENTION

The tungsten oxide film-forming composition according to the present invention comprises a water-soluble metatungstate, a particular additive, and water. Those components will be individually explained below.

Metatungstate

The water-soluble metatungstate contains tungsten, which serves as a direct material of tungsten oxide constituting the tungsten oxide film. Although there are various known so-called tungstates, such as, polytungstates, orthotungstates and paratungstates, the present invention adopts a metatungstate. This is because, if the tungsten oxide film is intended to be formed from a composition containing a tungsten compound other than metatungstates, there are fears that the compound may have insufficient solubility and that the composition may be poor in film-formability. Accordingly, if other tungsten compounds are employed, it is difficult to obtain a tungsten oxide film excellent in properties.

Here, the metatungstate is generally represented by the formula:

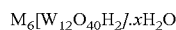

in which M is hydrogen, ammonium or a monovalent metal; and x is the number of crystallization water molecules. In the case where M is hydrogen, the above formula represents an acid. However, in the present invention, the term "metatungstate" includes that case for convenience. The number x of crystallization water molecules may take some possible values, but there are no restrictions on the number x.

The metatungstate may contain any metal, but in view of availability it is preferably selected from the group consisting of metatungstic acid, ammonium metatungstate, potassium metatungstate, and sodium metatungstate. Since the tungsten oxide film-forming composition of the present invention is mainly used in processes for producing semiconductor devices, metal-free metatungstates, such as, metatungstic acid and ammonium metatungstate, are particularly preferred. Further, the composition of the present invention contains a relatively high concentration of the metatungstate, which tends to show considerably high acidity. Accordingly, in order to keep the pH value of the composition adequately, it is preferred to employ ammonium metatungstate.

Additive

The composition of the present invention for forming a tungsten oxide film contains a particular additive. Specifically, the composition according to the present invention comprises at least one, additive selected from the group consisting of anionic polymers, nonionic polymers, anionic surfactants, and tertiary amino group-containing nonionic surfactants.

The anionic polymer, which is a polymer containing an anionic group, is not particularly restricted but preferably contains carboxyl or sulfo group. It is particularly preferred for the anionic polymer to be represented by the following formula (1):

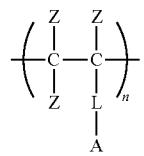

in which each Z is independently hydrogen, methyl or fluorine;

L is a divalent linking group selected from the group consisting of single bond, a hydrocarbon group which may contain an oxygen atom provided that the total number of carbon and oxygen atoms is in the range of 1 to 6, and a group in which at least one hydrogen atom in said hydrocarbon group is replaced with a fluorine atom; and A is —COOM or —SO$_3$M in which M is hydrogen ion, ammonium ion or a monovalent metal ion. Examples of the anionic polymer include polyacrylic acid, polymethacrylic acid, perfluoro-polyacrylic acid, perfluoro-polymethacrylic acid, and polystyrenesulfonic acid. Those are generally easily available and inexpensive, and hence preferred. For example, there are various commercially available polymethacrylic acids, such as, PAA20EX ([trademark], manufactured by TOHO Chemical Industry Co., Ltd.). Further, the polymer FST-100 ([trademark], manufactured by ASAHI GLASS CO., LTD.), in which all the groups Z are fluorine atoms and L is —O—(CF$_2$)$_3$—, is also preferably adopted because it can achieve both excellent coatability and film-formability.

There are no particular restrictions on the nonionic polymer, which is a polymer containing no ions, as long as it is water-soluble, and hence any nonionic polymer can be employed. The nonionic polymer is preferably selected from the group consisting of polyvinyl pyrrolidone, polyvinyl alcohol, polyoxazoline, polysaccharides, and derivatives thereof. Various nonionic polymers are commercially available. There are many commercially available nonionic polymers having different molecular weights, such as, polyvinyl pyrrolidone Luvitec K-30 ([trademark], manufactured by BASF), polyvinyl alcohol POVAL HP-H105 ([trademark], manufactured by KURARAY CO., LTD.), and polyoxazoline EPOCROS WS-300 ([trademark], manufactured by NIPPON SHOKUBAI CO., LTD.). Further, it is also preferred to use polysaccharides, such as, pullulan, dextrin, cyclodextrin and cellulose. Pullulan is particularly preferred.

There are no particular restrictions on the molecular weight of the anionic or nonionic polymer. However, for example, in order to form a sufficiently continuous film by spin-coating, the weight average molecular weight is preferably 1000 or more, further preferably 3000 or more. On the other hand, in view of coatability, the weight average molecular weight is preferably 300000 or less, further preferably 120000 or less.

Those polymers function as the additives, whereby the tungsten oxide film-forming composition of the present invention can realize high film-formability. Specifically, even if an aqueous solution of the metatungstate is alone cast on a substrate or the like, it is difficult to form an even film. However, since the polymer is adopted as the additive, the composition can form a satisfying film owing to film-formability of the polymer.

Even if polymers other than the above particular polymers have film-formability in themselves, they do not always enable the composition to form an excellent film. For example, cationic or amphoteric polymers are coagulated and deposited when mixed with the metatungstate, and the deposited coagulates remarkably impair evenness of the film when the composition is cast. The present invention, therefore, adopts an anionic or nonionic polymer so as to ensure both sufficient coatability and solubility in the composition.

Further, the tungsten oxide film-forming composition according to the present invention may contain an anionic surfactant or a tertiary amino group-containing nonionic surfactant as the additive.

Any known anionic surfactant can be selected to use, and the anionic surfactant may be fluorinated. Preferred examples of the anionic surfactant include alkylsulfonic acid, alkylcarboxylic acid, ammonium salts thereof, potassium salts thereof, and sodium salts thereof. There are no particular restrictions on the alkyl group as long as it functions as a hydrophobic group of the surfactant. For example, in the alkyl group, methylene groups may be partly substituted with ether bonds. Specifically, the alkylsulfonic acid, alkylcarboxylic acid or a salt thereof has preferably 4 to 24, more preferably 8 to 16 carbon atoms. More specifically, preferred are perfluorooctanesulfonic acid, which is often referred to as "PFOS"; perfluorooctanoic acid, which is often referred to as "PFOA"; compounds, such as, sodium alkylcarboxylates; and Pionin A-32-FW ([trademark], manufactured by Takemoto Oil & Fat Co., Ltd.), which is a mixture of alkylsulfonic acids having 10 to 18 carbon atoms.

The tungsten oxide film-forming composition of the present invention can contain a tertiary amino group—containing nonionic surfactant. It should be noted that nonionic surfactants containing no tertiary amino groups cannot be used in the present invention because they form solid precipitates in the coating procedure. The surfactant preferably has a long-chain alkyl or polyalkyleneoxy group connecting to a nitrogen atom. Here, the "long-chain alkyl group" means an alkyl group having 4 to 24, preferably 8 to 18 carbon atoms. This alkyl group may be substituted with a nonionic group such as an alkoxy group as long as the substitution does not impair the effect of the present invention. The polyalkyleneoxy group, which is a polymer of alkyleneoxy groups, may be a polymer of two or more kinds of alkyleneoxy groups. Those alkyleneoxy groups may be polymerized at random or to form blocks. Preferred examples of the alkyleneoxy groups include ethyleneoxy group and propyleneoxy group.

There are various known tertiary amino group—containing nonionic surfactants. Examples of them include polyoxyalkylene alkylamino ether, ethylene-oxide/propyleneoxide adduct of triethanolamine, and ethylene-oxide/propyleneoxide adduct of ethylenediamine. Specifically, $C_{18}H_{37}N(CH_2CH_2O)_n(CH_2CH_2O)_mNR_3$ and $R_2NCH_2CH_2NR_2$ ($R=[(CH_2CH_2O)_n(CH_2CH(CH_3)O)_mH]$) can be used, and they are commercially available, for example, under the tradename "Pionin D3240" ([trademark], manufactured by Takemoto Oil & Fat Co., Ltd.).

Those surfactants do not have so large film-formability in themselves as the above-described polymers, but they have a function of reducing the contact angle of the composition on the substrate. This function is presumed to enhance the affinity between the substrate surface and the composition containing the metatungstate and thereby to improve the film-formability.

The above additives can be used in combination, if necessary. For example, two or more polymers can be combined and/or two or more surfactants can be combined. As described above, the polymers are thought to differ from the surfactants in mechanism of improving film-formability. Accordingly, combinations of the polymers and the surfactants are expected to achieve large improvement and hence are particularly preferred.

Composition for Forming a Tungsten Oxide Film

The tungsten oxide film-forming composition according to the present invention comprises the above metatungstate, at least one of the above additives, and water.

There are no particular restrictions on the water to use, and any water can be used. For example, it is possible to use distilled water, degassed water, pure water or ultra pure water. Pure water or ultra pure water can be obtained by the steps of removing impurity ions with ion-exchange resins and then removing foreign particles through filters. Since used in processes for producing semiconductor devices, the composition of the present invention preferably contains a small amount of metal impurities, which are other than tungsten.

The composition of the present invention for forming a tungsten oxide film can be prepared by dissolving or dispersing the components in the above water. The blending amounts of the components are not particularly restricted, and hence can be freely determined according to the aim.

However, in order to obtain a tungsten oxide film having satisfying properties, the composition contains the water-soluble tungsten oxide in an amount of preferably 5 wt % or more, further preferably 10 wt % or more, based on the total weight of the composition. If the water-soluble tungstate is contained in too a large amount, the film tends to suffer from troubles, such as, formation of defects caused by deposition of crystallites. Accordingly, the amount is preferably 70 wt % or less, further preferably 50 wt % or less.

There are no particular restrictions on the amount of the additive. However, in the case where the tungsten oxide film-forming composition of the present invention is employed in an image reversal trilayer process or in formation of a resist undercoat layer, the amount of the additive is preferably 0.5 to 20 wt %, more preferably 1 to 10 wt %, based on the amount of the metatungstate contained in the composition. If the tungsten oxide film contains organic components in a large amount, voids are often formed when an etching procedure is carried out for forming an image reversal trilayer structure or a resist undercoat layer. Further, if the film contains crystalline parts, defects tend to be formed in the course of the etching procedure because the etching rate is different between in the crystalline parts and in the amorphous parts. However, if the amount of the additive is in the above range, the formed film is sufficiently amorphous and hardly suffers from formation of voids. On the other hand, in the case where the composition of the present invention is used for forming a resist top protective film, it is unnecessary to consider crystallinity of the film and formation of voids because the etching procedure does not need to be carried out. Accordingly, in that case, the amount of the additive can be selected from a wider range.

The tungsten oxide film-forming composition according to the present invention can contain other additional components, if necessary. Examples thereof include acidic or basic compounds for pH control and thickening agents for viscosity control. The amount of each additive is determined in view of the effect thereof, but is generally 10 wt % or less, preferably 1 wt % or less, based on the amount of the metatungstate. As described above, it is not preferred to use polymers other than the anionic or nonionic polymers and surfactants other than the anionic or tertiary amino group-containing nonionic surfactants.

Formation of Tungsten Oxide Film

The composition of the present invention for forming a tungsten oxide film is cast to form a coat on the aimed substrate or resist layer, and then heated to convert the coat into a tungsten oxide film. The method of casting or heating is not particularly restricted and can be properly selected according to necessity. Examples of the casting method include spin coating, spray coating, dip coating, slit coating, brush coating, and curtain coating. Any of them can be selected to use. However, spin coating is most preferred because it can form a film having very even thickness and also because the composition has relatively high viscosity.

The thickness of the coat is selected according to the use of the aimed tungsten oxide film, but is generally so controlled that the formed film has a thickness of 25 to 200 nm. The formed film having that thickness hardly undergoes crystallization and hence is a highly transparent amorphous film.

There are also no particular restrictions on the heating temperature and time. The coat is generally heated at a high temperature so as to accelerate the hardening reaction. However, the temperature and time for heating are properly determined in consideration of materials of adjacent layers and the like.

Pattern Formation Method Using Image Reversal Trilayer Structure

The tungsten oxide film-forming composition according to the present invention can be employed in a pattern formation process using an image reversal trilayer structure (hereinafter, that process is often referred to as "IRT process").

There are some known prior arts on conventional IRT processes (e.g., Non-patent document 1), which are simply explained below with reference to FIG. 1.

A hard mask 2 is formed on a substrate 1, and then a photoresist pattern 3 is formed thereon (FIG. 1(A)). By way of example, the following describes a case where the substrate and the hard mask are a silicon substrate and a carbon mask, respectively, but they by no means restrict the present invention. The substrate may be made of any material, which can be freely selected according to the aim. Examples of the substrate material include semiconductors, such as, silicon and germanium; electroconductive substances, such as, aluminum, copper and aluminum silicide; and insulators, such as, silicon dioxide and silicon nitride. There are no particular restrictions on the method for forming the photoresist pattern, which can be formed by any method. Specifically, it can be formed by a normal lithographic method or by printing.

The photoresist pattern 3 is then coated with another hard mask 4 made of silicon dioxide by casting and heating a silicon dioxide film-forming composition containing polysilazane, polysiloxane or the like (FIG. 1(B)).

Subsequently, the surface of the silicon dioxide hard mask 4 is subjected to dry-etching with $CF_4/O_2$ gas so as to bare the top of the resist pattern 3 (FIG. 1(C)). The etching conditions such as gas species are so selected that the hard mask 4 can be etched efficiently.

The remaining resist pattern 3 is removed, if necessary, and then the dry-etching is carried out with $O_2$ gas. In this way, the pattern corresponding to the initial photoresist pattern 3 can be transferred onto the hard mask 2 (FIG. 1(D)). In this stage, the carbon hard mask 2 is etched by use of the silicon dioxide hard mask 4 as a photomask. Accordingly, the etching conditions are so selected that carbon can be etched more efficiently than silicon dioxide. In other words, the etching conditions are so determined that carbon may have a high etching selection ratio to silicon dioxide. Those conditions are mainly obtained by selecting the gas species, but what gas species to select depends on the aimed material. The gas species, therefore, should be properly selected according to the material.

The composition according to the present invention for forming a tungsten oxide film can be adopted in place of the silicon dioxide film-forming composition used in the above IRT process. Specifically, the pattern formation process of the present invention comprises the steps of:

forming a hard mask on a substrate;

forming a photoresist pattern according to the aimed pattern on said hard mask;

casting on said photoresist pattern and then heating the above composition for forming a tungsten oxide film, so as to cover said photoresist pattern with a tungsten oxide film;

removing by etching the tungsten oxide film formed in the area on the top surface of said photoresist pattern, so as to bare the top surface of said photoresist pattern; and removing by etching said photoresist pattern by use of said tungsten oxide film as a photomask, and further transferring said photoresist pattern onto said hard mask.

Conventional methods for coating and heating the silicon dioxide film-forming composition can be directly applied to the pattern formation process of the present invention. However, since the composition of the present invention differs from that for forming a silicon dioxide film in components, the coating and heating methods should be properly modified according to the composition of the present invention. Specifically, the heating temperature is preferably 60 to 180° C., more preferably 80 to 150° C. If the temperature is too high, the resist pattern is damaged. Accordingly, attention should be paid to the temperature. On the other hand, if the temperature is too low, it is impossible to form a sufficiently hardened tungsten oxide film. The heating time is preferably 30 to 300 seconds, more preferably 30 to 120 seconds.

As compared with the conventionally used silicon dioxide film-forming composition comprising polysilazane or the like, the tungsten oxide film-forming composition of the present invention has low reactivity and hence gives few effects to the adjacent layers in forming the tungsten oxide film. Further, the formed tungsten oxide film can be easily removed by, for example, washing with water, and hence the treatment can be carried out all over again.

Moreover, the tungsten oxide film differs from the silicon dioxide film in the etching rate according to the gas species. Accordingly, even if the same hard mask is intended to be etched, the etching selection ratio between the photomask and the hard mask can be changed by adopting the tungsten oxide film as the photomask in place of the silicon dioxide film. As a result, the tungsten oxide film has the advantage of realizing a favorable etching selection ratio.

Pattern Formation Method Using Resist Undercoat Layer

The tungsten oxide film-forming composition according to the present invention can be employed in a pattern formation process using a resist undercoat layer. It has been conventionally known to form a resist undercoat layer from the silicon dioxide film-forming composition (e.g., Non-patent documents 2 and 3).

There may be a case where a photoresist-made pattern formed directly on a silicon substrate is etched and transferred so as to form the pattern on the substrate. However, in that case, the etching selection ratio between the photoresist and the silicon substrate is often so inadequate that the pattern cannot be transferred sufficiently. To cope with that, a process has been adopted in which a resist undercoat layer comprising a silicon dioxide film and a carbon hard mask is formed between the photoresist-made pattern and the silicon substrate, then the photoresist-made pattern is transferred by an etching procedure onto the silicon dioxide film or the carbon hard mask, and finally the pattern transferred on the silicon dioxide film or the carbon hard mask is further transferred by another etching procedure onto the silicon substrate.

The silicon dioxide film included in the multi-film resist undercoat layer used in the above pattern formation process can be replaced with a tungsten oxide film formed from the tungsten oxide film-forming composition of the present invention, or otherwise the resist undercoat layer as a whole can be replaced with the tungsten oxide film. Accordingly, conventional methods for coating and heating the composition for forming a silicon dioxide film in the formation process of the resist undercoat layer can be directly applied to the pattern formation process of the present invention. Specifically, that pattern formation process comprises the steps of:

casting on a substrate and then heating the above composition for forming a tungsten oxide film, so as to form a tungsten oxide film;

forming a photoresist pattern on said tungsten oxide film;

etching said tungsten oxide film by use of said photoresist pattern as a photomask, so as to transfer the photoresist pattern onto the tungsten oxide film; and etching said substrate by use of said patterned tungsten oxide film as a photomask.

If a resist undercoat layer comprising a tungsten oxide film and a carbon hard mask is intended to be adopted in the above process, the substrate is previously coated with the carbon hard mask before the tungsten oxide film-forming composition is applied thereon.

The composition contains different components as compared with the case where the silicon dioxide film is adopted. Accordingly, the coating and heating methods should be modified according to them. Specifically, the heating temperature is preferably 200 to 500° C., more preferably 220 to 400° C. In the course of the process for forming the resist undercoat layer, there are no layers damaged by heating. It is, therefore, possible to heat the composition at a relatively high temperature. Even so, however, if the temperature is too high, it is necessary to pay attention not to damage the substrate. On the other hand, if the temperature is too low, it is impossible to form a sufficiently hardened tungsten oxide film. The heating time is preferably 30 to 600 seconds, more preferably 120 to 300 seconds.

As described above for the IRT process, the tungsten oxide film differs from the silicon dioxide film in the etching rate according to the gas species. Accordingly, even when the same silicon substrate is intended to be etched, the etching selection ratio can be improved by adopting the tungsten oxide film as the photomask in place of the silicon dioxide film. The tungsten oxide film thus has the advantage of realizing a favorable etching selection ratio. The tungsten oxide film according to the present invention can be also employed in place of a silicon film in a conventional process in which the etching procedure is carried out by use of a carbon hard mask.

Formation of Resist Top Protective Film

The composition of the present invention for forming a tungsten oxide film can be employed for forming a protective film covering a resist layer in a lithographic pattern formation method. That resist top protective film brings effects different from those of known top anti-reflection coats or the like.

The resist top protective film can be used in the same manner as top anti-reflection coats in conventional pattern formation processes. Specifically, the pattern formation process according to the present invention may comprise the steps of:

casting a resist composition on a substrate, so as to form a resist layer;

casting on said resist layer and then heating the above composition for forming a tungsten oxide film, so as to form a tungsten oxide film;

carrying out imagewise exposure; and carrying out development. The tungsten oxide film thus formed on the resist layer functions as the top protective film.

The heating temperature for forming a tungsten oxide film is preferably 60 to 150° C., more preferably 60 to 130° C. The heating time is preferably 30 to 300 seconds, more preferably 30 to 120 seconds. The reasons of them are the same as those described above for the IRT process.

Further, the tungsten oxide film can be also adopted as a resist top coat in normal exposure procedures. The tungsten oxide film absorbs light in the wavelength range where photoacid generators or photo-reactive compounds are made to react by light, and therefore can serve as a filter removing light of unfavorable wavelength. For example, the film can be expected to function as a filter in an exposure procedure using extreme ultraviolet light of 1 to 500 nm, ArF laser light, KrF laser light, i-rays or g-rays. In recent lithographic processes for manufacturing semiconductor devices, the exposure procedures are often carried out by use of short-wavelength light so as to meet the demand of miniaturizing patterns. Accordingly, extreme ultraviolet light (wavelength: 1 to 30 nm) has come into use. However, the extreme ultraviolet light is said to generally contain far ultraviolet light in an amount of about 10%, and it is known that this far ultraviolet light causes troubles, such as, deterioration of pattern CD homogeneity, impairment of surface roughness, lowering of sensitivity, and degradation of resolution.

The tungsten oxide film according to the present invention has a characteristic of absorbing light in the far ultraviolet wavelength range. Accordingly, if adopted as a top protective film, the tungsten oxide film functions as a filter to improve the surface roughness.

The present invention is explained below by use of examples.

EXAMPLES 1 to 36 and COMPARATIVE EXAMPLES 37 to 43

(1) Preparation of Composition for Forming a Tungsten Oxide Film

Various additives and pure water were mixed with 50 wt % aqueous solution of ammonium metatungstate, to prepare tungsten oxide film-forming compositions of Examples. With respect to each example, Table 1 shows the amount of ammonium metatungstate (based on the total weight of each composition), the additive and the amount thereof (in terms of wt % based on the weight of the ammonium metatungstate).

TABLE 1

| Examples | Ammonium meta-tungstate Amount (wt %) | Additives Category | Substance | Chemical structure | Molecular weight | Amount*[1] (wt %) |
|---|---|---|---|---|---|---|
| Ex. 1 | 10.0 | anionic surfactant | alkylsulfonic acids*[2] | $C_nH_{2n+1}SO_3H$ | 330 | 1.0 |
| Ex. 2 | 16.7 | | | (mixture of n = 10~18) | 330 | 1.0 |
| Ex. 3 | 40.0 | | | | 330 | 1.0 |
| Ex. 4 | 50.0 | | | | 330 | 1.0 |
| Ex. 5 | 16.7 | anionic surfactant | alkylsulfonic acids*[2] | $C_nH_{2n+1}SO_3H$ | 330 | 0.5 |
| Ex. 6 | 16.7 | | | (mixture of n = 10~18) | 330 | 10.0 |
| Ex. 7 | 16.7 | | | | 330 | 20.0 |
| Ex. 8 | 16.7 | anionic surfactant | perfluorooctanesulfonic acid | $C_8H_{17}SO_3H$ | 500 | 1.0 |
| Ex. 9 | 16.7 | | | | 500 | 10.0 |
| Ex. 10 | 16.7 | anionic surfactant | sodium alkylcarboxylate | $C_{12}H_{23}COONa$ | 234 | 1.0 |
| Ex. 11 | 16.7 | | | | 234 | 10.0 |
| Ex. 12 | 16.7 | amine group-containing nonionic surfactant | stearylaminoethylene oxide adduct*[3] | $C_{18}H_{37}N(CH_2CH_2O)_n(CH_2CH_2O)_m$ | 2000 | 1.0 |
| Ex. 13 | 16.7 | | | | 2000 | 10.0 |
| Ex. 14 | 16.7 | amine group-containing nonionic surfactant | triethanolamine ethylene oxide propylene oxide adduct | $N[CH_2CH_2O)_n(CH_2CH_2CH_2O)_mH]_3$ | 4800 | 1.0 |
| Ex. 15 | 16.7 | | | | 4800 | 10.0 |
| Ex. 16 | 16.7 | anionic polymer | polyacrylic acid | $[CH_2CH(COOH)]_n$ | 700 | 1.0 |
| Ex. 17 | 16.7 | | | | 700 | 10.0 |
| Ex. 18 | 16.7 | anionic polymer | polyacrylic acid*[4] | $[CH_2CH(COOH)]_n$ | 3000 | 1.0 |
| Ex. 19 | 40.0 | | | | 3000 | 1.0 |
| Ex. 20 | 50.0 | | | | 3000 | 1.0 |
| Ex. 21 | 16.7 | anionic polymer | polyacrylic acid*[4] | $[CH_2CH(COOH)]_n$ | 3000 | 0.5 |
| Ex. 22 | 16.7 | | | | 3000 | 10.0 |
| Ex. 23 | 16.7 | | | | 3000 | 20.0 |
| Ex. 24 | 16.7 | anionic polymer | fluorine-containing ethylenic carboxylic acid polymer*[5] | $[CF_2CF(OC_3H_6COOH)]_n$ | 5000 | 1.0 |
| Ex. 25 | 16.7 | | | | 5000 | 10.0 |
| Ex. 26 | 16.7 | nonionic polymer | polyvinylpyrrolidone*[6] | $[CH_2CH(C_4H_6ON)]_n$ | 30000 | 1.0 |
| Ex. 27 | 16.7 | | | | 30000 | 10.0 |
| Ex. 28 | 16.7 | nonionic polymer | polyvinyl alcohol*[7] | $[CH_2CH(OH)]_n$ | 10000 | 1.0 |
| Ex. 29 | 16.7 | nonionic polymer | polyoxazoline | $[CH_2N(CHO)]_n$ | 120000 | 1.0 |
| Ex. 30 | 16.7 | | | | 120000 | 10.0 |
| Ex. 31 | 16.7 | nonionic polymer | polysaccharide | pullulan | 100000 | 1.0 |
| Ex. 32 | 16.7 | | | | 100000 | 10.0 |
| Ex. 33 | 16.7 | nonionic polymer | polyvinylpyrrolidone*[6] alkylsulfonic acids*[2] | $[CH_2CH(C_4H_6ON)]_n$ $C_nH_{2n+1}SO_3H$ (mixture of n = 10~18) | 30000 330 | 10.0 1.0 |
| Ex. 34 | 16.7 | anionic polymer tertiary amino group-containing nonionic surfactant | polyacrylic acid*[4] stearylaminoethylene oxide adduct*[3] | $[CH_2CH(COOH)]_n$ $C_{18}H_{37}N(CH_2CH_2O)_n(CH_2CH_2O)_m$ | 3000 2000 | 10.0 1.0 |
| Ex. 35 | 16.7 | anionic polymer | poly-p-styrene sulfonic acid | $[CH_2CH(C_6H_4SO_3H)]_n$ | 5000 | 1.0 |
| Ex. 36 | 16.7 | | | | 5000 | 10.0 |
| Com. 37 | 16.7 | nonionic surfactant | acetylene glycol ethylene oxide propylene oxide adduct*[8] | | 600 | 1.0 |
| Com. 38 | 16.7 | nonionic surfactant | ethylene oxide propylene oxide block copolymer (3:1) | | 800 | 1.0 |
| Com. 39 | 16.7 | cationic polymer | polyallylamine | $[CH_2CH(CH_2NH_2)]_n$ | 3000 | 1.0 |
| Com. 40 | 16.7 | cationic polymer | polyvinyl imidazole | $[CH_2CH(C_3H_3N_2)]_n$ | 9000 | 1.0 |
| Com. 41 | 16.7 | cationic polymer | polyaminopropyl siloxane | | 5000 | 1.0 |
| Com. 42 | 0.0 | | polyaminopropyl siloxane (4.8 wt %) | | 5000 | |
| Com. 43 | 0.0 | | polyaminopropyl siloxane (2.4 wt %) | | | |

*[1]The amounts of the additives are in terms of weight percent based on the weight of the ammonium metatungstate.
*[2]Pionin A-32-FW ([trademark], manufactured by Takemoto Oil & Fat Co., Ltd.)
*[3]Pionin D3240 ([trademark], manufactured by Takemoto Oil & Fat Co., Ltd.)
*[4]PAA20EX ([trademark], manufactured by TOHO Chemical Industry Co., Ltd.)
*[5]FST-100 ([trademark], manufactured by ASAHI GLASS CO., LTD.)
*[6]Luvitec K-30 ([trademark], manufactured by BASF)
*[7]POVAL HP-H105 ([trademark], manufactured by KURARAY CO., LTD.)
*[8]Surfynol 2502 ([trademark], manufactured by Nissin Chemical Industry CO., Ltd)

Solubility of Composition

In the process for preparing each tungsten oxide film-forming composition, the solubility and solution stability were evaluated according to the following criteria:

A: the composition was transparent both immediately after prepared and after left over night;

B: the composition was transparent immediately after prepared, but became clouded after left overnight; and D: the composition was transparent immediately after prepared, but was found to form precipitates after left overnight.

(2) Pattern Formation According to IRT Process

A bottom antireflection coat-forming composition KrF17B ([trademark], manufactured by AZ Electronic Materials (Japan) K.K.) was cast on an 8-inch wafer by means of a coater/developer Mark 8 ([trademark], manufactured by Tokyo Electron Limited) at 2377 rpm, and then baked at 180° C. for 60 seconds to form a bottom antireflection coat of 80 nm thickness.

The wafer surface provided with the bottom antireflection coat was again coated with a resist composition AZ DX6270P ([trademark], manufactured by AZ Electronic Materials (Japan) K.K.) at 3300 rpm, and then subjected to soft-baking treatment at 120° C. for 60 seconds to form a resist layer of 350 nm thickness.

The wafer on which the resist layer was thus formed was then subjected to exposure with radiation of 248 nm wavelength in an exposure amount of 19 mJ by means of a KrF excimer laser stepper FPA3000 ([trademark], manufactured by Canon Inc.). Subsequently, the exposed wafer was subjected to post-baking treatment at 130° C. for 60 seconds by means of the coater/developer, and thereafter developed with 2.38% TMAH for 60 seconds. This procedure formed a line-and-space pattern having a line width of 200 nm and a pitch of 1:1.

The wafer on which the line-and-space pattern was thus formed was further coated with each tungsten oxide film-forming composition by means of the coater/developer at 3000 rpm. The coat was then heated at 120° C. for 60 seconds, to form a layer in which the resist pattern was covered with a tungsten oxide film.

The wafer on which the tungsten oxide film was thus formed was etched with $CF_4/O_2$ mixed gas for 20 seconds by means of a dry etcher NE-5000N ([trademark], manufactured by ULVAC Inc.) on the conditions of: $CF_4$ flow: 7.5 sccm; $O_2$ flow: 42.5 sccm; antenna power: 100 W; and bias power: 100 W. This etching removed the tungsten oxide film on the top of the resist pattern.

The obtained wafer was further etched for 20 seconds on the conditions of: $O_2$ flow: 50 sccm; antenna power: 100 W; and bias power: 100 W. As a result, the whole resist pattern was removed to leave a tungsten oxide-made line-and-space pattern having a height of 300 nm, a line width of 200 nm and a pitch of 1:1. However, exceptionally in Comparative example 42, the obtained pattern was made of silicon dioxide and had a height of 200 nm, a line width of 200 nm and a pitch of 1:1.

The wafer on which the tungsten oxide-made line-and-space pattern was thus formed was furthermore etched for 40 seconds on the conditions of: $CF_4$ flow: 50 sccm; antenna power: 100 W; and bias power: 100 W. As a result of this etching procedure, the tungsten oxide-made pattern was directly transferred onto the wafer.

In the above process for forming an image reversal trilayer structure, each example was evaluated in the following terms.

Coatability

When cast on the resist pattern, each tungsten oxide film-forming composition was evaluated in coatability according to the following criteria:

A: a continuous film was formed;
B: slight crystallization was observed;
C1: crystallization was observed, and it was impossible to form a continuous film (practically unusable); and
C2: many defects were observed in the formed film (practically unusable).

Pattern Shape

The sectional shape of the tungsten oxide-made line-and-space pattern was observed and evaluated according to the following criteria:

A: the composition formed a tungsten oxide-made line-and-space pattern of high rectangularity;
B: the composition formed a tungsten oxide-made line-and-space pattern of some shape; and
C: the composition formed too rough a film to serve as a line-and-space pattern (practically unusable).

Voids in Pattern

It was evaluated whether or not the tungsten oxide-made line-and-space pattern contained voids, and thereby the examples were classified into the following grades:

A: no voids were observed in the tungsten oxide-made line-and-space pattern;
B: a few voids were observed in the tungsten oxide-made line-and-space pattern; and
C: many voids were observed in the tungsten oxide-made line-and-space pattern (practically unusable).

Transferability onto Wafer

When the tungsten oxide-made pattern was transferred by dry-etching onto the silicon wafer, each example was evaluated in transferability according to the following criteria:

A: a silicon-made line-and-space pattern of high rectangularity was formed on the silicon wafer;
B: a silicon-made line-and-space pattern was formed on the silicon wafer, but the pattern had slightly poor rectangularity; and
C: a silicon-made line-and-space pattern was not formed on the silicon wafer (practically unusable).

(3) Application of Tungsten Oxide Film as Resist Undercoat Layer

Each tungsten oxide film-forming composition was cast on an 8-inch wafer by means of a coater/developer Mark 8 ([trademark], manufactured by Tokyo Electron Limited) at 3000 rpm, and then baked at 250° C. for 300 seconds to form a tungsten oxide film of 54 nm thickness on the wafer surface.

The wafer surface was then again coated with a resist composition AZ DX6270P ([trademark], manufactured by AZ Electronic Materials (Japan) K.K.) at 3300 rpm, and then subjected to soft-baking treatment at 120° C. for 60 seconds to form a resist layer of 350 nm thickness.

The wafer on which the resist layer was thus formed was subjected to exposure with radiation of 248 nm wavelength in an exposure amount of 10 mJ by means of a KrF excimer laser stepper FPA3000 ([trademark], manufactured by Canon Inc.). Subsequently, the exposed wafer was subjected to post-baking treatment at 130° C. for 60 seconds by means of the coater/developer, and thereafter developed with 2.38% TMAH for 60 seconds. This procedure formed a resist-made line-and-space pattern having a line width of 200 nm and a pitch of 1:1.

The obtained wafer was etched for 20 seconds on the conditions of: $CF_4$ flow: 50 sccm; antenna power: 100 W; and bias power: 100 W to transfer the resist pattern onto the tungsten oxide film, and thereafter further etched for 20 seconds on the conditions of: $O_2$ flow: 50 sccm; antenna power: 100 W; and bias power: 100 W to remove the remaining resist pattern. Subsequently, the wafer was furthermore etched for 20 seconds on the conditions of: $CF_4$ flow: 50 sccm; antenna power: 100 W; and bias power: 100 W to transfer the tungsten oxide-made pattern onto the wafer.

In the above pattern formation process, each example was evaluated in the following terms.

Coatability

When cast on the silicon wafer surface, each tungsten oxide film-forming composition was evaluated in coatability according to the following criteria:

A: a continuous film was formed;
B: minor discontinuity, slight crystallization or some defects were observed;
C1: the composition could not be spread enough to form a film (practically unusable);
C2: many defects or crystallites were observed in the formed film (practically unusable).
C3: the spread composition formed some aggregates, and discontinuity was observed in the film (practically unusable).

Voids after Etching

It was evaluated whether or not the tungsten oxide film contained voids, and thereby the examples were classified into the following grades:

A: no voids were observed in the tungsten oxide film;
B: a few voids were observed in the tungsten oxide film; and
C: many voids were observed in the tungsten oxide film (practically unusable).

Transferability onto Wafer

When the tungsten oxide-made pattern was transferred by dry-etching onto the silicon wafer, each example was evaluated in transferability according to the following criteria:

A: a silicon-made line-and-space pattern of high rectangularity was formed on the silicon wafer;
B: a silicon-made line-and-space pattern was formed on the silicon wafer, but the pattern had slightly poor rectangularity; and
C: a silicon-made line-and-space pattern was not formed on the silicon wafer (practically unusable).

(4) Application of Tungsten Oxide Film as Resist Top Protective Film

A bottom antireflection coat-forming composition KrF17B ([trademark], manufactured by AZ Electronic Materials (Japan) K.K.) was cast on an 8-inch wafer by means of a coater/developer Mark 8 ([trademark], manufactured by Tokyo Electron Limited) at 2377 rpm, and then baked at 180° C. for 60 seconds to form a bottom antireflection coat of 80 nm thickness.

The wafer surface provided with the bottom antireflection coat was again coated with a resist composition AZ DX6270P ([trademark], manufactured by AZ Electronic Materials (Japan) K.K.) at 3300 rpm, and then subjected to soft-baking treatment at 120° C. for 60 seconds to form a resist layer of 350 nm thickness.

The wafer on which the resist layer was thus formed was further coated with each tungsten oxide film-forming composition by means of the coater/developer at 3000 rpm, and then the coat was heated at 120° C. for 60 seconds.

The wafer on which the tungsten oxide film was thus formed was then subjected to exposure with radiation of 248 nm wavelength in an exposure amount of 39 mJ by means of a KrF excimer laser stepper FPA3000 ([trademark], manufactured by Canon Inc.). Subsequently, the exposed wafer was subjected to post-baking treatment at 130° C. for 60 seconds by means of the coater/developer, and thereafter developed with 2.38% TMAH for 60 seconds. This procedure formed a line-and-space pattern having a line width of 200 nm and a pitch of 1:1.

In the above process for forming a resist top protective film, each example was evaluated in the following terms.

Coatability

When cast on the resist pattern surface, each tungsten oxide film-forming composition was evaluated in coatability according to the following criteria:

A: a continuous film was formed;
B: slight crystallization was observed;
C1: crystallization was observed, and it was impossible to form a continuous film (practically unusable); and
C2: many defects were observed in the formed film (practically unusable).

Removability

It was evaluated how easily the tungsten oxide film formed on the resist layer was removed by washing with deionized water after the pattern was formed. The criteria were as follows:

A: the tungsten oxide film formed on the resist layer was rapidly and completely removed with deionized water;
B: the tungsten oxide film formed on the resist layer was completely removed with deionized water;
C: the tungsten oxide film formed on the resist layer could not be removed with deionized water (practically unusable).

The obtained results are shown in Table 2.

TABLE 2

| Examples | Solubility of composition | Pattern formation according to IRT process | | | | Application as a resist undercoat layer | | | Application as a top protective film | |
| --- | --- | --- | --- | --- | --- | --- | --- | --- | --- | --- |
| | | coat-ability | pattern shape | voids | transfer-ability | coat-ability | voids | transfer-ability | coat-ability | remov-ability |
| Ex. 1 | A | A | A | A | — | A | A | — | A | A |
| Ex. 2 | A | A | A | A | A | A | A | A | A | A |
| Ex. 3 | A | B | A | A | — | A | B | — | B | A |
| Ex. 4 | A | B | A | B | — | B | B | — | B | A |
| Ex. 5 | A | — | — | — | — | B | — | — | — | — |
| Ex. 2 | A | A | A | A | A | A | A | A | A | A |
| Ex. 6 | A | A | A | A | A | A | A | — | A | A |
| Ex. 7 | A | — | — | — | — | B | — | — | — | — |
| Ex. 8 | A | A | A | A | — | A | A | — | A | A |
| Ex. 9 | A | A | A | A | — | A | A | — | A | A |
| Ex. 10 | A | A | A | A | — | A | A | — | A | A |
| Ex. 11 | A | A | A | A | — | A | A | — | A | A |
| Ex. 12 | A | A | A | A | — | A | A | — | A | A |
| Ex. 13 | A | A | A | A | — | A | A | — | A | A |
| Ex. 14 | A | A | A | A | — | A | A | — | A | A |
| Ex. 15 | A | A | A | A | — | A | A | — | A | A |
| Ex. 16 | A | — | — | — | — | B | — | — | — | — |
| Ex. 17 | A | — | — | — | — | B | — | — | — | — |
| Ex. 18 | A | A | A | A | A | A | A | A | A | A |
| Ex. 19 | A | B | A | A | — | A | B | — | B | A |
| Ex. 20 | A | B | A | A | — | B | B | — | B | A |
| Ex. 21 | A | — | — | — | — | B | — | — | — | — |
| Ex. 18 | A | A | A | A | A | A | A | A | A | A |
| Ex. 22 | A | A | A | A | A | A | A | A | A | A |
| Ex. 23 | A | A | A | B | — | B | B | — | A | A |
| Ex. 24 | A | A | A | A | — | A | A | — | A | A |

TABLE 2-continued

| Examples | Solubility of composition | Pattern formation according to IRT process | | | | Application as a resist undercoat layer | | | Application as a top protective film | |
| --- | --- | --- | --- | --- | --- | --- | --- | --- | --- | --- |
| | | coat-ability | pattern shape | voids | transfer-ability | coat-ability | voids | transfer-ability | coat-ability | remov-ability |
| Ex. 25 | A | A | A | A | — | A | A | — | A | A |
| Ex. 26 | A | A | A | A | — | A | A | — | A | A |
| Ex. 27 | A | A | A | A | — | A | A | — | A | A |
| Ex. 28 | A | A | A | A | — | A | A | — | A | A |
| Ex. 29 | A | A | A | A | — | A | A | — | A | A |
| Ex. 30 | A | A | A | A | — | A | A | — | A | A |
| Ex. 31 | A | A | A | A | — | A | A | — | A | A |
| Ex. 32 | A | A | A | A | — | A | A | — | A | A |
| Ex. 33 | A | A | A | A | — | A | A | — | A | A |
| Ex. 34 | A | A | A | A | A | A | A | A | A | A |
| Ex. 35 | A | A | A | A | — | A | A | — | A | A |
| Ex. 36 | A | A | A | A | — | A | A | — | A | A |
| Com. 37 | B | — | — | — | — | C1 | — | — | — | — |
| Com. 38 | B | — | — | — | — | C1 | — | — | — | — |
| Com. 39 | C | C2 | C | — | — | C2 | A | — | C2 | A |
| Com. 40 | C | C2 | C | — | — | C2 | A | — | C2 | A |
| Com. 41 | C | C2 | C | — | — | C2 | A | — | C2 | A |
| Com. 42 | — | A | B | A | B | — | — | — | — | — |
| Com. 43 | — | — | — | — | — | — | A | B | — | — |

In the above table, "—" in the cells means "unevaluated".

DESCRIPTION OF THE NUMERALS

1: substrate
2: hard mask
3: resist pattern
4: hard mask

The invention claimed is:

1. A composition for forming a tungsten oxide film, comprising water, a water-soluble metatungstate, and at least one additive selected from the group consisting of anionic polymers, nonionic polymers, anionic surfactants, and tertiary amino group-containing nonionic surfactants; said composition being used for forming an image reversal trilayer structure, a resist undercoat layer or a resist top protective film wherein said additive is an anionic polymer represented by the following formula (1):

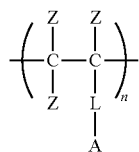

(1)

in which
each Z is independently hydrogen, methyl or fluorine;
L is a divalent linking group selected from the group consisting of single bond, a hydrocarbon group which may contain an oxygen atom provided that the total number of carbon and oxygen atoms is in the range of 1 to 6, and a group in which at least one hydrogen atom in said hydrocarbon group is replaced with a fluorine atom; and
A is —COOM or —SO$_3$M in which M is hydrogen ion, ammonium ion or a monovalent metal ion.

2. The composition according to claim 1 for forming a tungsten oxide film; wherein said water-soluble metatungstate is selected from the group consisting of metatungstic acid, ammonium metatungstate, potassium metatungstate, and sodium metatungstate.

3. The composition according to claim 1 for forming a tungsten oxide film, wherein said water-soluble metatungstate is contained in an amount of 10 to 50 wt % based on the total weight of the composition.

4. A composition for forming a tungsten oxide film, comprising water, a water-soluble metatungstate, and at least one additive selected from the group consisting of anionic polymers, nonionic polymers, anionic surfactants, and tertiary amino group-containing nonionic surfactants; said composition being used for forming an image reversal trilayer structure, a resist undercoat layer or a resist top protective film wherein said additive is a nonionic polymer selected from the group consisting of polyvinyl pyrrolidone, polyvinyl alcohol, polyoxazoline, polysaccharides, and derivatives thereof.

5. A composition for forming a tungsten oxide film, comprising water, a water-soluble metatungstate, and at least one additive selected from the group consisting of anionic polymers, nonionic polymers, anionic surfactants, and tertiary amino group-containing nonionic surfactants; said composition being used for forming an image reversal trilayer structure, a resist undercoat layer or a resist top protective film wherein said additive is an anionic surfactant selected from the group consisting of an alkylsulfonic acid which may be fluorine-substituted and which has 4 to 24 carbon atoms, an alkylcarboxylic acid which may be fluorine- substituted and which has 4 to 24 carbon atoms, ammonium salts thereof, potassium salts thereof, and sodium salts thereof.

6. A composition for forming a tungsten oxide film, comprising water, a water-soluble metatungstate, and at least one additive selected from the group consisting of anionic polymers, nonionic polymers, anionic surfactants, and tertiary amino group-containing nonionic surfactants; said composition being used for forming an image reversal trilayer structure, a resist undercoat layer or a resist top protective film wherein said additive is selected from the group consisting of tertiary amino group-containing nonionic surfactants having alkylene oxide adducts.

7. A process for forming a tungsten oxide film, wherein the composition according to claims 1 for forming a tungsten oxide film is cast on a substrate and then fired.

8. The process for forming a tungsten oxide film of claim 7 on a substrate further comprising the steps of forming a photoresist pattern on said tungsten oxide film;

etching said tungsten oxide film by use of said photoresist pattern as a photomask, so as to transfer the photoresist pattern onto the tungsten oxide film; and etching said substrate by use of said patterned tungsten oxide film as a photomask.

9. The pattern formation method according to claim 8, wherein said composition for forming a tungsten oxide film contains said additive in an amount of 0.5 to 20 wt % based on the amount of the metatungstate contained therein.

10. The pattern formation method according to claim 8, wherein said substrate is previously covered with a carbon hard mask before said composition for forming a tungsten oxide film is cast thereon.

11. The pattern formation method according to claim 8, wherein said composition for forming a tungsten oxide film is cast and then heated at 200 to 500° C. for 30 to 600 seconds.

12. A pattern formation method comprising the steps of:

forming a hard mask on a substrate;

forming a photoresist pattern according to the aimed pattern on said hard mask;

casting on said photoresist pattern and then heating the composition according to claim 1 for forming a tungsten oxide film, so as to cover said photoresist pattern with a tungsten oxide film;

removing by etching the tungsten oxide film formed in the area on the top surface of said photoresist pattern, so as to bare the top surface of said photoresist pattern; and removing by etching said photoresist pattern by use of said tungsten oxide film as a photomask, and further transferring said photoresist pattern onto said hard mask.

13. The pattern formation method according to claim 12, wherein said composition for forming a tungsten oxide film contains said additive in an amount of 0.5 to 20 wt % based on the amount of the metatungstate contained therein.

14. The pattern formation method according to claim 12, wherein said composition for forming a tungsten oxide film is cast and then heated at 60 to 180° C. for 30 to 300 seconds.

15. A pattern formation method comprising the steps of:

casting a resist composition on a substrate, so as to form a resist layer;

casting on said resist layer and then heating a composition for forming a tungsten oxide film, so as to form a tungsten oxide film and where the composition for forming a tungsten oxide film, comprising water, a water-soluble metatungstate, and at least one additive selected from the group consisting of anionic polymers, nonionic polymers, anionic surfactants, and tertiary amino group-containing nonionic surfactants;

carrying out imagewise exposure; and carrying out development.

16. The pattern formation method according to claim 15, wherein said imagewise exposure is carried out by use of light of 1 to 500 nm wavelength.

17. The pattern formation method according to claim 15, wherein said composition for forming a tungsten oxide film is cast and then heated at 60 to 150° C. for 30 to 300 seconds.

\* \* \* \* \*